(12) United States Patent
Nakagawa et al.

(10) Patent No.: US 8,605,241 B2
(45) Date of Patent: Dec. 10, 2013

(54) BIAXIAL BIREFRINGENT COMPONENT, LIQUID CRYSTAL PROJECTOR, AND METHOD FOR MANUFACTURING BIAXIAL BIREFRINGENT COMPONENT

(75) Inventors: Kenichi Nakagawa, Tokyo (JP); Hiroki Takahashi, Tokyo (JP); Taro Hashizume, Kanagawa (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 431 days.

(21) Appl. No.: 12/679,240

(22) PCT Filed: Sep. 18, 2008

(86) PCT No.: PCT/JP2008/067360
§ 371 (c)(1),
(2), (4) Date: Mar. 19, 2010

(87) PCT Pub. No.: WO2009/038218
PCT Pub. Date: Mar. 26, 2009

(65) Prior Publication Data
US 2010/0231835 A1    Sep. 16, 2010

(30) Foreign Application Priority Data
Sep. 21, 2007  (JP) .................................. 2007-245921

(51) Int. Cl.
*G02F 1/1335* (2006.01)
(52) U.S. Cl.
USPC ........................................................ 349/118
(58) Field of Classification Search
None
See application file for complete search history.

(56) References Cited

U.S. PATENT DOCUMENTS

| 5,196,953 | A |   | 3/1993 | Yeh et al. |
| 5,504,603 | A |   | 4/1996 | Winker et al. |
| 5,557,434 | A | * | 9/1996 | Winker et al. ................. 349/117 |
| 5,619,352 | A |   | 4/1997 | Koch et al. |
| 5,638,197 | A |   | 6/1997 | Gunning, III et al. |
| 2002/0128341 | A1 |   | 9/2002 | Sakai et al. |

(Continued)

FOREIGN PATENT DOCUMENTS

| EP | 0 179 640 A2 | 4/1986 |
| EP | 0 676 660 A1 | 10/1995 |

(Continued)

OTHER PUBLICATIONS

Notification of Reasons for Refusal issued in the corresponding Japanese Patent Application No. 2007-245921 dated Apr. 5, 2010, and an English Translation thereof.

(Continued)

*Primary Examiner* — Sarah Hahm
(74) *Attorney, Agent, or Firm* — Buchanan Ingersoll & Rooney PC

(57) ABSTRACT

A phase compensator having a biaxial birefringent component (40) is fabricated by oblique deposition of an inorganic material on a base plate (69). A polar angle of an evaporation path of the inorganic material is controlled in a predetermined angular range to a surface normal of the base plate (69). In the oblique deposition process, the base plate (69) is oscillated in a horizontal direction. The phase compensator is arranged such that its slow axis (L4) is perpendicular to a slow axis (L3) of tilt components (24*a*, 24*b*) in a liquid crystal panel (20), and that an index ellipsoid (41) is tilted in an opposite direction to a tilt direction of the tilt components (24*a*, 24*b*).

4 Claims, 7 Drawing Sheets

(56) References Cited

U.S. PATENT DOCUMENTS

| | | |
|---|---|---|
| 2004/0004688 A1* | 1/2004 | Kawata et al. ............... 349/117 |
| 2004/0085487 A1 | 5/2004 | Chen et al. |
| 2005/0168662 A1 | 8/2005 | Nakagawa |
| 2007/0258029 A1 | 11/2007 | Nakagawa et al. |
| 2009/0115941 A1 | 5/2009 | Nakagawa |

FOREIGN PATENT DOCUMENTS

| | | |
|---|---|---|
| JP | 5-132768 A | 5/1993 |
| JP | 9-296265 A | 11/1997 |
| JP | 10-330940 A | 12/1998 |
| JP | 11-263861 A | 9/1999 |
| JP | 2001-108832 A | 4/2001 |
| JP | 2002-014345 A | 1/2002 |
| JP | 2002-031782 A | 1/2002 |
| JP | 2002-131750 A | 5/2002 |
| JP | 2004-102200 A | 4/2004 |
| JP | 2006-505014 | 2/2006 |
| JP | 2006-171328 A | 6/2006 |
| JP | 2006-292784 A | 10/2006 |
| JP | 2007-017485 A | 1/2007 |
| JP | 2007-086406 A | 4/2007 |
| JP | 2008-224922 A | 9/2008 |
| JP | 2008-242411 A | 10/2008 |

OTHER PUBLICATIONS

Office Action from Chinese Patent Office issued in corresponding Chinese Patent Application No. 200880107754.X dated Jun. 16, 2011, with an English translation.

International Search Report (PCT/ISA/210) for PCT/JP2008/067360 dated Dec. 22, 2008.

Written Opinion (PCT/ISA/237) for PCT/JP2008/067360 dated Dec. 22, 2008.

MacLeod, H.A., "Structure-Related Optical Properties of Thin Films", J. Vac. Sci. Technol. A, 1986, pp. 418-422, vol. 4, No. 3.

European Office Action (extended European search report) issued Oct. 22, 2012, in corresponding European Patent Application No. 08832696.2.

Motohiro et al., "Thin film retardation plate by oblique deposition," Applied Optics, vol. 28, No. 13, Jul. 1, 1989, pp. 2466-2482, XP000032694.

Japanese Office Action (Notification of Reasons for Refusal) issued on Nov. 22, 2012, in corresponding Japanese Patent Application No. 2010-273726 and partial translation.

Office Action (Notification of Reasons for Refusal) issued Mar. 25, 2013 in corresponding Japanese Patent Application No. 2010-273726, and an English translation thereof.

* cited by examiner

BIAXIAL BIREFRINGENT COMPONENT, LIQUID CRYSTAL PROJECTOR, AND METHOD FOR MANUFACTURING BIAXIAL BIREFRINGENT COMPONENT

TECHNICAL FIELD

The present invention relates to a biaxial birefringent component used with liquid crystal panels for compensating optical retardance, a method for manufacturing the same, and liquid crystal projectors.

BACKGROUND ART

Liquid crystal projectors are widely used to project images on a screen. The liquid projectors are classified into two types, a front-projection type to project images from the front side of a screen, and a rear-projection type to project images from the rear side of a screen.

Also, liquid crystal panels (liquid crystal cells) are classified into a transmission type and a reflection type, each of which is used in the liquid crystal projector. When projecting an image, the liquid crystal projector firstly generates information light by casting light onto a liquid crystal panel that displays an image, and projects the information light through a projection lens to form an image on a screen. However, the liquid crystal panels, which act on different liquid crystal modes, can only provide a relatively narrow field-of-view in each liquid crystal mode.

In a normally white TN (twisted nematic) liquid crystal panel, for example, linearly polarized rays that enter perpendicular to a liquid crystal layer with no voltage applied will rotate their polarization wave fronts by 90° along twist-aligned liquid crystal molecules. These linearly polarized rays pass through a polarizer allocated on a light exit side of the liquid crystal panel, and the TN liquid crystal panel appears white (white display state). When a voltage is applied to the liquid crystal layer, in contrast, the liquid crystal molecules are released from the twist alignment and linearly polarized rays entering perpendicular to the liquid crystal layer will pass through the liquid crystal layer without rotating their polarization wave fronts. These linearly polarized rays are blocked by the polarizer, and the TN liquid crystal panel appears black (black display state).

Even in the black display state, however, the liquid crystal layer offers birefringence to obliquely incident light. In other words, light rays obliquely entering the TN liquid crystal panel in the black display state have phase difference and are modulated into elliptically-polarized rays during the passage through the liquid crystal layer. The elliptically-polarized rays pass through the polarizer on the light exit side, and lower the density of black display, narrowing the field-of-view of the TN liquid crystal panel.

This problem results from the liquid crystal molecules lying near substrates that hold the liquid crystal layer. These liquid crystal molecules are not aligned perpendicular to the substrate surfaces completely even when a voltage is applied to the liquid crystal layer. Namely, in the vicinity of the substrates, the liquid crystal molecules are aligned such that more distant molecules from the substrates are more tilted to the substrate surfaces. These gradually-tilted liquid crystal molecules (hereinafter, tilt components) are birefringent to the light rays passing obliquely through the liquid crystal layer, whereas they exhibit little birefringence to the light rays passing orthogonally through the liquid crystal layer. As a result, light modulation performance of the TN liquid crystal panel depends on the angle-of-incidence of a light ray to the liquid crystal layer, and affects the density of black display. Note that, in the liquid crystal projectors, a light ray enters a pixel from a conical area with a cone angle of approximately 15° to a surface normal of the liquid crystal panel.

Such angle dependence is not only found in the TN liquid crystal panels, but also in the liquid crystal panels of other liquid crystal modes, such as VAN, OCB and ECB, so long as they contain the tilt components in the black display state.

As for direct-view-type liquid crystal display devices, on the other hand, contrast degradation problem due to the angle dependence can be eliminated by a phase compensator. For example, a phase compensator of this type has been marketed as "Fuji WV Film wide-view A" (product name/WV film) from Fujifilm Corporation. Also, a thin film of an obliquely deposited material on a base plate (hereinafter, oblique deposition film) can be used as a phase compensator. Having a birefringence property, the oblique deposition film is able to compensate the phase difference caused by the tilt components, and expand the field-of-view of the liquid crystal panels (see, for example, U.S. Pat. No. 5,638,197).

In the meanwhile, the phase compensators are also used in the liquid crystal projectors so as to improve contrast of a projection image. For example, there is a liquid crystal projector having a phase compensator made of inorganic material such as the aforesaid WV film (Japanese Patent Laid-open Publication No. 2002-14345). Another exemplary usage is a liquid crystal projector having a phase compensator made of discotic liquid crystal molecules solidified in hybrid orientation (Japanese Patent Laid-open Publication No. 2002-131750).

Exemplary usage of the phase compensator made of an inorganic material would be found in prior art, such as Japanese Patent Laid-open Publication No. 2002-31782 which discloses using a single crystal sapphire, quartz or such uniaxial birefringent substance as the inorganic material phase compensator, U.S. Pat. No. 5,196,953 which discloses a liquid crystal projector having a birefringence structure of inorganic thin-film stack, and Japanese Patent Laid-open Publication No. 2004-102200 which discloses a liquid crystal projector using a combination of several phase compensators of different inorganic materials. In addition, European Patent Application Publication No. 0179640 discloses a method for manufacturing an A-plate in which a material is obliquely deposited on a revolving base plate inside an evaporator.

In general, a birefringent characteristic is represented by an index ellipsoid defined by three principal refractive indices. All the aforesaid phase compensators function as an O-plate that has an index ellipsoid tilted to the surface of the liquid crystal panel, and provide good contrast of projection images for liquid crystal projectors. Additionally, inorganic material oblique deposition films are biaxial birefringence in most cases, and used as O-plates. These oblique deposition films are known to have three principal refractive indices of different amplitudes (see, "Structure-related Optical Properties of Thin Films" by H. Angus Macleod, J. Vac. Sci. Technol. A, Volume 4, No. 3, 1986, pp. 418-422). The largest and smallest principal refractive indices are tilted to the base plate surface.

A phase compensator, when made of an organic material, would easily discolor if exposed to UV-containing intense light for a longtime. Especially, in the liquid crystal projectors which use a higher intensity light source and hit higher temperature than the direct-view-type liquid crystal monitors, the organic material phase compensator would be as weak as to start discoloring in only 2,000-3,000 hours.

When made from a birefringent crystal such as the single crystal sapphire or quartz, a phase compensator becomes durable enough, but high-precision control is required for a cutting surface and thickness of the crystal, making the phase compensator too expensive to use for commercial products.

As mentioned above, the oblique deposition film of inorganic material is a biaxial birefringent component. Conventional oblique deposition films cannot completely compensate the phase difference due to the tilt components. In other words, in the conventional oblique deposition films, a slow axis of retardation, when viewed from a surface normal direction of the base plate (hereinafter, frontal retardation), is normally parallel to a plane including a direction of the oblique deposition and the surface normal of the base plate. By changing an angle of evaporation, it is possible to make the slow axis perpendicular to this plane, but the frontal retardation would still only have a small value. Therefore, if the conventional inorganic material oblique deposition film is used to compensate the phase difference caused by the tilt components, a retarder having an optic axis parallel to the surface of the liquid crystal panel or an A-plate has to be used in combination.

In view of the forgoing, an object of the present invention is to provide a durable, low cost and easily manufacturable biaxial brefringent component which by itself can properly compensate phase difference in liquid crystal panels.

DISCLOSURE OF INVENTION

In order to achieve the above and other objects, a biaxial birefringent component according to the present invention comprises a film of an inorganic material deposited obliquely on a base plate, and has principal refractive indices $n1$, $n2$, $n3$ and a slow axis. The principal refractive index $n1$ resides in a plane including a direction of the oblique deposition and a surface normal of the base plate, and is tilted at an angle of not less than 10° and not greater than 50° to the surface normal. The principal refractive index $n2$ is parallel to a surface of the base plate. The principal refractive index $n3$ is perpendicular to the principal refractive indices $n1$ and $n2$. The principal refractive indices $n1$, $n2$ and $n3$ satisfy relational expressions of $n1 > n3$ and $(n2-n3)/(n1-n3) > 0.3$. The slow axis is substantially parallel to said principal refractive index $n2$ when retardance is measured from a direction of the surface normal.

A liquid crystal projector according to the present invention includes at least one phase compensator composed of a base plate and at least one biaxial birefringent component formed on the base plate. This liquid crystal projector further includes a liquid crystal panel (liquid crystal cell) to change alignment of liquid crystal molecules in response to a voltage applied thereto, and at least a part of the liquid crystal molecules is tilted in a black display state. In a preferred embodiment of the present invention, at least one biaxial birefringent component is oriented such that its slow axis is perpendicular to a slow axis of the tilted liquid crystal molecule, and that the principal refractive index $n1$ is tilted in an opposite direction to a tilt direction of the tilted liquid crystal molecules.

A manufacturing method for a biaxial birefringent component according to the present invention includes a step of performing oblique deposition while periodically changing an azimuth angle of an evaporation path of an inorganic material to a base plate within a predetermined angular range.

It is preferred, in this oblique deposition process, to oscillate the base plate between a part of a circular path around an axis parallel to a surface normal of the base plate.

It is also preferred, in the oblique deposition process, to revolve the base plate and provide the inorganic material to the revolving base plate from an evaporation source disposed at a predetermined distance from an axis of the revolution. In this case, it is preferred to isolate the base plate from the evaporation source in a part of a path of the revolution.

According to the present invention, the phase difference caused by tilted liquid crystal molecules in the liquid crystal layer is compensated properly, and image contrast is improved for the liquid crystal projector. The phase compensator is composed of the biaxial birefringent component made by oblique deposition of an inorganic material, and it offers durability and low cost manufacturability.

BEST MODE FOR CARRYING OUT THE INVENTION

To improve image contrast for a liquid crystal projector, phase difference has to be compensated to a maximum possible extent in a field-of-view range required for image projection when a liquid crystal panel of the liquid crystal projector displays black.

As mentioned above, the liquid crystal panels in such liquid crystal modes as TN, VAN, OCB or ECB, contain liquid crystal molecules tilted to a surface of a substrate (hereinafter, tilt components) in a black display state. These tilt components modulate the light rays obliquely passing through the liquid crystal panel, and allow the modulated light rays to pass through a polarizer, resulting to lower the image contrast of the liquid crystal projector.

Therefore, to improve the image contrast of the liquid crystal projector, an index ellipsoid of a phase compensator need be tilted in accordance with the tilt components. Nonetheless, merely using a retarder having an index ellipsoid tilted to the liquid crystal surface or an O-plate as the phase compensator cannot offer proper viewing angle compensation for the phase difference caused by the vertical components in the liquid crystal layer.

Figure 1:
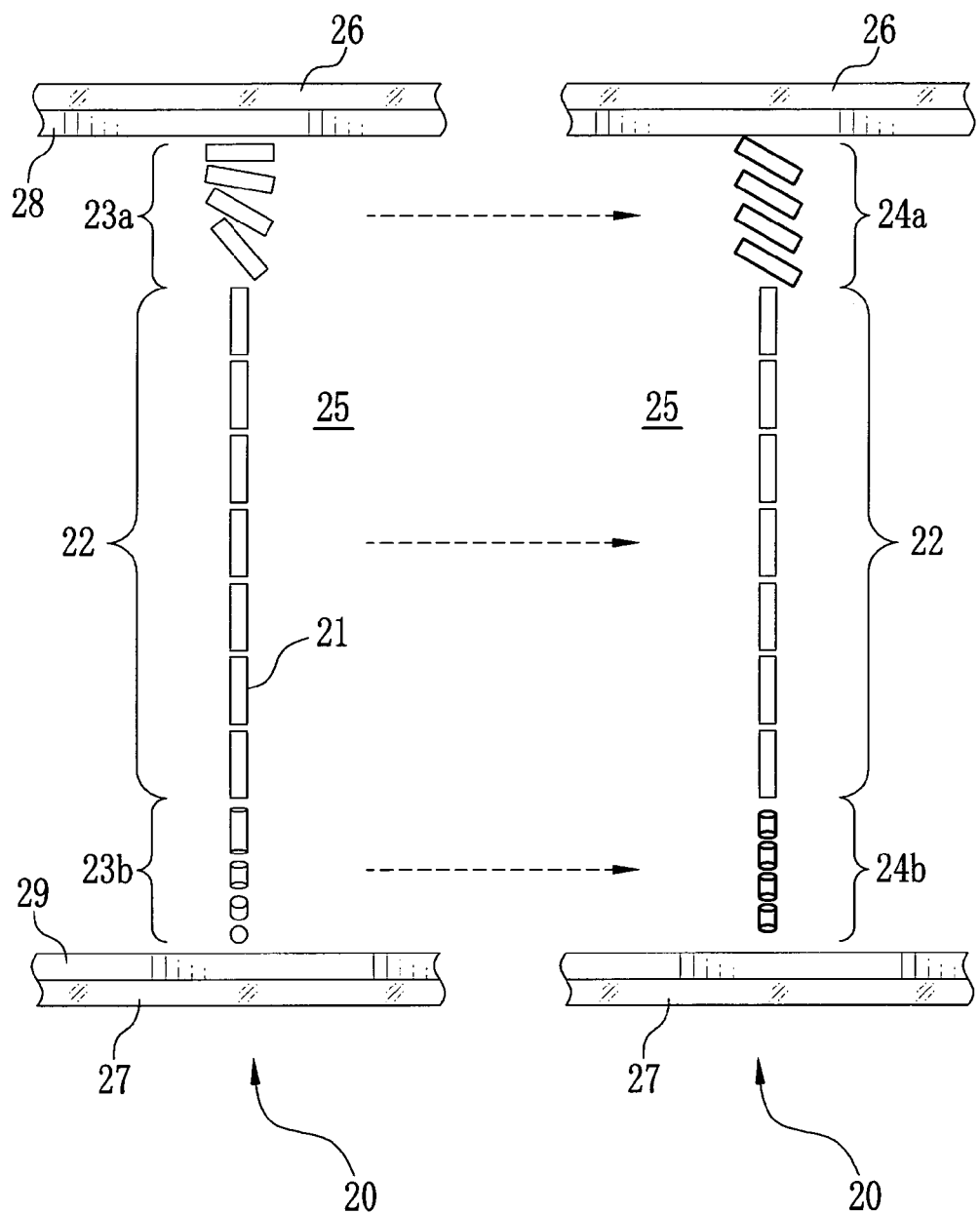
FIGS. 1A and 1B are explanatory views illustrating alignment of liquid crystal molecules.

As shown in FIG. 1A, in the black display state, liquid crystal molecules 21 in a TN liquid crystal panel 20 can be separated into vertical components 22 and tilt components 23 based on their alignment. The vertical components 22, which reside in the center of a liquid crystal layer 25, are released from a twisted-alignment phase and almost uniformly aligned perpendicular to substrate surfaces in the black display state.

On the other hand, the tilt components 23 reside in the vicinity of the substrate surfaces, and are separated into components 23a near one substrate 26 and components 23b near the other substrate 27. In the black display state, the tilt components 23 are aligned to increase the tilt angle gradually as they are distant from the substrates 26, 27. In the meanwhile, reference numerals 28, 29 are alignment films attached to the interior surfaces of the substrates (which are made of glass or the like).

In FIG. 1B, the tilt components 23a are approximated to tilt components 24a at an identical tilt angle. Similarly, the tilt components 23b are approximated to tilt components 24b at an identical tilt angle. Each of these tilt components 24a, 24b can be regarded as a uniaxial positive O-plate. The vertical components 22, which are nearly uniformly aligned perpendicular to the substrate surfaces as mentioned above, can be regarded as a positive C-plate.

Therefore, to compensate the phase difference properly throughout a predetermined field-of-view range, the phase compensator needs to be fabricated in accordance with the tilt components 24a (or 24b). Particularly, when a symmetry plane of a tilt component 24a (or 24b) is defined as a plane perpendicular to the substrate 26 (or 27) and including the alignment direction of the tilt component 24a (or 24b), and a symmetry plane of an index ellipsoid of the phase compensator is defined as a plane including principal refractive indices n1 and n3, the following three conditions should be satisfied:

1. The symmetry planes of the tilt component 24a (or 24b) and the index ellipsoid coincide substantially with each other.
2. The tilt component 24a (or 24b) and the index ellipsoid are tilted in opposite directions with reference to the surface of the substrate.
3. The slow axis of frontal retardation caused by the tilt component 24a (or 24b) is orthogonal to the slow axis of frontal retardation caused by the phase compensator.

Nonetheless, the condition 1 is not necessarily strict, but it needs to be roughly satisfied. For example, the condition 1 is regarded as satisfied by a phase compensator whose index ellipsoids are aligned to twist gradually along the thickness direction so as to compensate the slightly twisting molecules in the tilt components.

Figure 2:
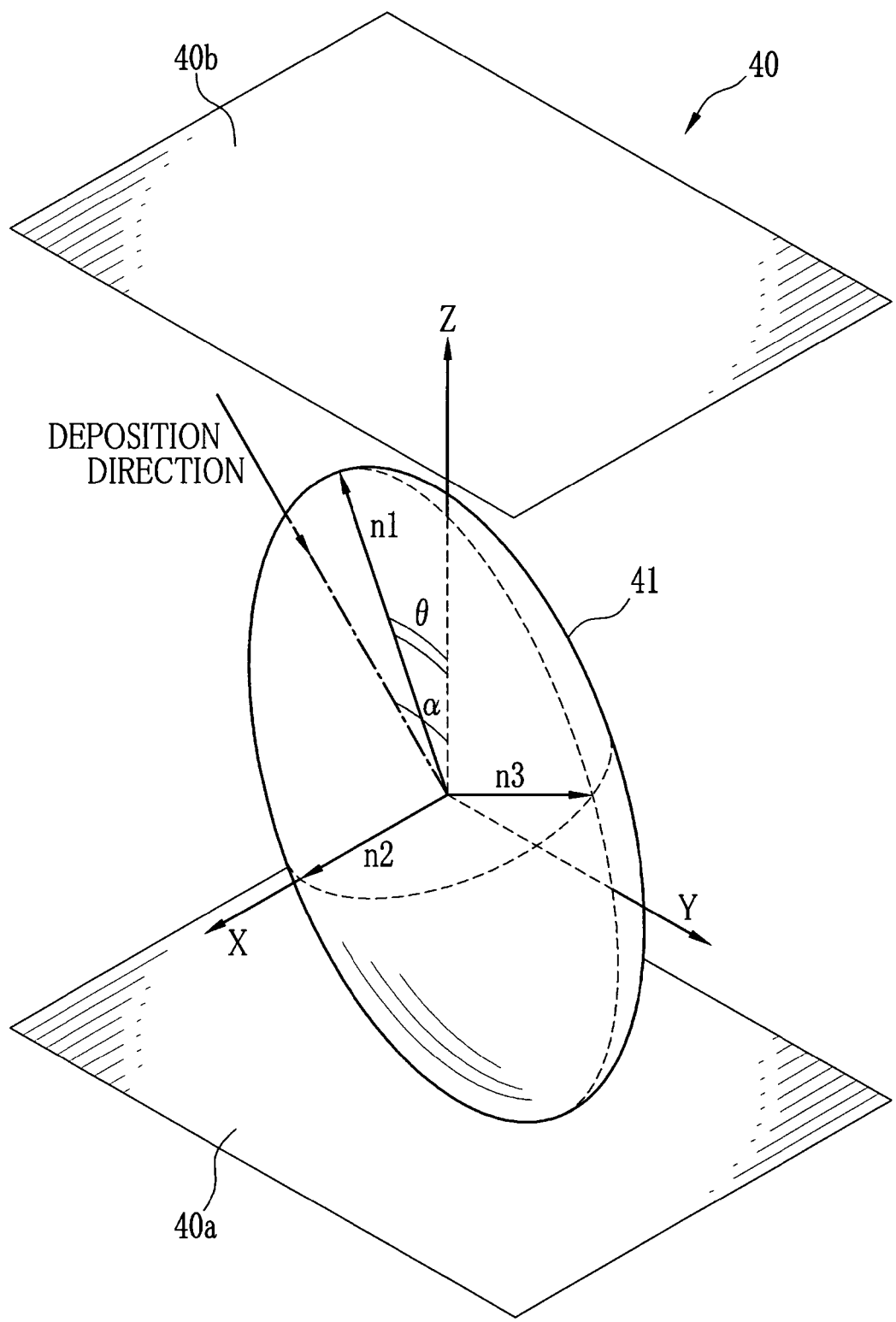
FIG. 2 is an explanatory view of an index ellipsoid representing a biaxial birefringent component made by oblique deposition.

A biaxial birefringent component 40 is made from an inorganic material, and used as the phase compensator. In a preferred embodiment shown in FIG. 2, the biaxial birefringent component 40 is an oblique deposition film which is fabricated by oblique deposition of an inorganic material onto a base plate (not shown). In the drawing, reference numerals 40a, 40b designate a bottom surface and a top surface of the biaxial birefringent component 40 respectively. The bottom surface 40a makes contact with the base plate.

The principal refractive index n1 of the biaxial birefringent component 40 resides in a plane defined by a direction from which the inorganic material is evaporated to the base plate (hereinafter, deposition direction) and a surface normal of the base plate. The principal refractive index n2 resides in an X-axis direction which is perpendicular to the principal refractive index n1 and parallel to the base plate surface. The principal refractive index n3 resides in a direction perpendicular to the principal refractive indices n1, n2. It should be noted that an index ellipsoid 41 defined by the principal refractive indices n1, n2 and n3 is not tilted in the deposition direction generally. In other words, when the surface normal of the biaxial birefringent component 40 is regarded as a positive direction on a Z-axis, a (polar) angle α between the Z-axis and the deposition direction does not coincide with an angle θ between the Z-axis and the principal refractive index n1. Relationship between the polar angle α and the tilt angle θ of the index ellipsoid 41 depends on various factors including the character of the evaporator to be used and the property of an inorganic material. Meanwhile, a Y-axis direction is perpendicular to the X-axis and Z-axis directions.

When the biaxial birefringent component 40 is used as a phase compensator to satisfy the above conditions, the thickness of the biaxial birefringent component 40 and the tilt angle θ of the index ellipsoid 41 are determined on the basis of a retardance (dΔn) of the liquid crystal panel and a voltage applied in the black display state.

Additionally, the optical characterization of the biaxial birefringent component in the oblique deposition film depends on the principal refractive indices n1, n2, n3, the tilt angle θ of n1 to the surface normal, and the thickness of the film. The values of these parameters are determined by various conditions, such as an inorganic material (deposition material) to be used, type and shape of an evaporator and conditions for deposition, and should be controlled by experimentally obtained manufacturing conditions. For example, the tilt angle θ can be controlled by an angle between an evaporation source and the base plate. Also, the thickness of the film can be controlled by an amount of the deposition material.

To express amplitude relation between the principal refractive indices n1, n2 and n3 which are necessary for the above condition 3, a value T derived from an equation $T=(n2-n3)/(n1-n3)$ is introduced. Idiomatically speaking, an angle between the two optic axes of the biaxial birefringent component 40 can be labeled as "optically positive" or "optically negative" across a 90-degree angle. When the optic axes are unmeasurable, however, this labeling is difficult and the amplitude relation cannot be expressed numerically. This is the reason the value T is used in this specification.

The value T corresponds to the shape of the index ellipsoid. For example, when the value T is approximately 0, the index ellipsoid is a positive uniaxial birefringent centered on a symmetry axis in the direction of the principal refractive index n1. When the value T is approximately 1.0, the index ellipsoid is a negative uniaxial birefringent centered on a symmetry axis in the direction of the principal refractive index n3. Except for such specific values for T, the index ellipsoid is usually biaxial. Furthermore, the birefringent component may have the value T of 1 and above, and in this case the value T still corresponds to the shape of the index ellipsoid.

The oblique deposition film usually has the value T between 1.0 and 0. Especially, with a conventional oblique deposition method where the tilt angle between the base plate surface and the evaporation source is fixed, the resultant oblique deposition film has the value T between 0.05 and 0.3 approximately. Namely, n2 has the value closer to the value of n3, and the index ellipsoid is elongated in the direction of n1. Taking the oblique deposition film of the above prior art document "Structure-related Optical Properties of Thin Films" as an example, the value T is between 0.13 and 0.26 as shown in Table 1 below. Table 1 shows that the value T for $ZrO_2$ films remains substantially constant even when the polar angle α (degrees) of the deposition direction is changed. This clarifies that the value T is difficult to control in the conventional oblique deposition method.

TABLE 1

| Inorganic Material | α (degrees) | n1 | n2 | n3 | T |
|---|---|---|---|---|---|
| $ZrO_2$ | 16.1 | 2.033 | 1.969 | 1.948 | 0.25 |
| $ZrO_2$ | 47.0 | 1.788 | 1.575 | 1.502 | 0.26 |
| $TiO_2$ | 16.1 | 2.552 | 2.452 | 2.437 | 0.13 |

The value T is closely related, not only with the tilt angle θ of the biaxial birefringent component but also, with a viewing angle expansion characteristic of a birefringent component. Namely, an optimum combination of the tilt angle θ and the value T brings an excellent viewing angle expansion characteristic and provides the best viewing angle compensation effect. It should be noted that the viewing angle to be compensated for the liquid crystal projectors is a 20-degree range from the surface normal, and that more than one combination of the tilt angle θ and the value T can provide the best viewing angle compensation effect.

To compensate the phase difference properly throughout the field-of-view range required for the liquid crystal projectors, the value T of the biaxial birefringent component 40 may be greater than 0.3 preferably, and greater than 0.5 more preferably, and greater than or equal to 0.6 yet more preferably. Additionally, the tilt angle θ of the index ellipsoid (i.e., the angle of the principal refractive index n1 to the surface normal of the substrate) may be not less than 10° and not greater than 50° preferably, and not less than 10° and not greater than 40° more preferably, and not less than 10° and not greater than 30° yet more preferably.

It should be noted that the optimum tilt angle θ will become larger as the value T becomes larger. Note also that it is possible to fabricate a birefringent component having a larger principal refractive index n2 than the principal refractive index n1, and therefore the amplitude of n2 may be determined in a practically attainable range.

It is three principal refractive indices and the tilt angle of the index ellipsoid that determine the angle dependence of the phase difference which the phase compensator causes. The biaxial birefringent component 40 is therefore fabricated in view of the three principal refractive indices, the tilt angle of the index ellipsoid, and the thickness of the film. As the film thickness increases, the phase difference caused by the birefringent component 40 increases. Additionally, a ratio of the phase differences between viewing angles, though the phase difference depends on the viewing angle, is determined not by the thickness of the film, but by the three principal refractive indices and the tilt angle of the index ellipsoid.

Therefore, to satisfy the above conditions 1 to 3, the film thickness and the amplitudes of principal refractive indices are determined such that the liquid crystal panel and the phase compensator cause the same amount but opposite sign phase differences. These parameters are, however, not determined uniformly, but determined independently in view of the retardance and the viewing angle characteristic of the liquid crystal panel.

The phase compensator according to the present invention is composed of a base plate and the birefringent component 40 in the form of a deposition film of an inorganic material obliquely deposited on the base plate. The oblique deposition process is carried out with changing the azimuth angle from which the inorganic material flies to the base plate.

Figure 3:
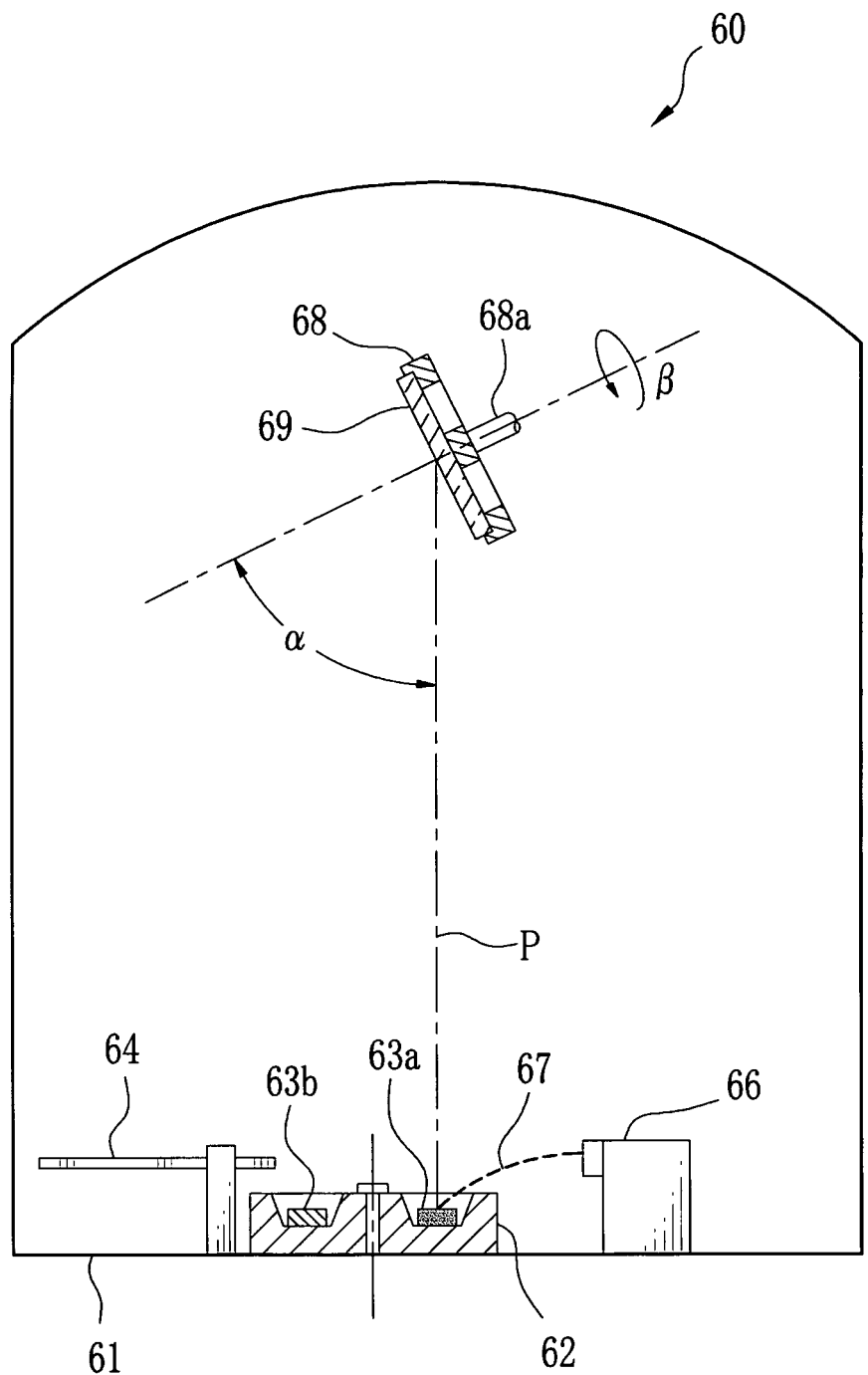
FIG. 3 is an explanatory view illustrating a configuration of an oscillating evaporator.

Specifically, an oscillating evaporator 60 shown in FIG. 3 is used. This oscillating evaporator 60 has a container 62 which rotates in a housing 61, just like a turret. The container 62 holds deposition materials 63a, 63b separately. The deposition material 63a is melted and evaporated in the evacuated housing 61 by an electron beam 67 irradiated from an electron gun 66, and vacuum deposition is performed. During the process, a shutter 64 is opened and closed to start and suspend the vacuum deposition. Additionally, the container 62 may be rotated to select one of the deposition materials 63a, 63b.

Above the container 62, a baseplate holder 68 is mounted aslant. The baseplate holder 68 holds a base plate 69 made of glass or the like. The baseplate holder 68 is slanted such that a surface normal of a holding surface of the baseplate holder 68 forms the angle α between an upright line P from the deposition material 63a. Therefore, a deposition surface of the base plate 69 is slanted to the line P by the angle α, and the polar angle of the deposition direction coincides with the angle α. Note that the baseplate holder 68 is rotatable around an axis perpendicular to a paper surface of the drawing, and the angle α can be adjusted to provide a desired polar angle.

Also, the baseplate holder 68 is rotatable around a shaft 68a. Rotating the baseplate holder 68 around the shaft 68a during the deposition process allows changing an azimuth angle β of the evaporation path of the deposition material 63a to a reference position of the base plate 69, with a constant polar angle. The phase compensator is thereby manufactured to satisfy the aforesaid conditions 1 to 3. It is preferred to swing forward and backward (oscillate) the baseplate holder 68 between a predetermined angular range around the shaft 68a. This angular range for oscillation is greater than 0° and not greater than 90° preferably, and not less than 10° and not greater than 90° more preferably, and not less than 10° and not greater than 60° yet more preferably.

Figure 4:
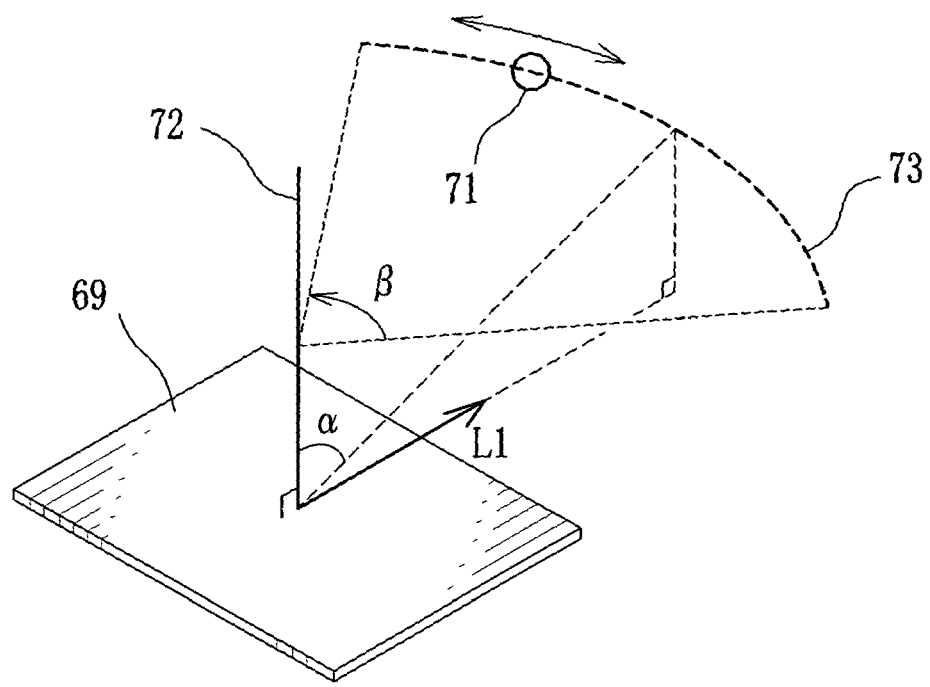
FIG. 4 is an explanatory view illustrating a deposition direction to an oscillating base plate.

As shown in FIG. 4, when viewed from the base plate 69, an evaporation source 71 oscillates on a circular arc path 73 centered on a rotation axis 72 which is parallel to the surface normal of the base plate 69. Specifically, this evaporation source 71 oscillates between the azimuth angle β while keeping the angle α constant to the base plate 69. In other words, the deposition material 63a comes from within a range of the azimuth angle β while keeping the polar angle at α, and accumulates on the base plate 69. In this process, the deposition material 63a spreads and accumulates in the direction of the principal refractive index n2, increasing the value of the principal refractive index n2 accordingly. Additionally, controlling the oscillation speed much faster than the accumulation speed can prevent a physical microstructure of a biaxial birefringent component from twisting in an S-shape, and allow the principal refractive index n1 to be tilted in a direction (average deposition direction) L1 defined by a time-averaged position of the evaporation source.

Figure 5:
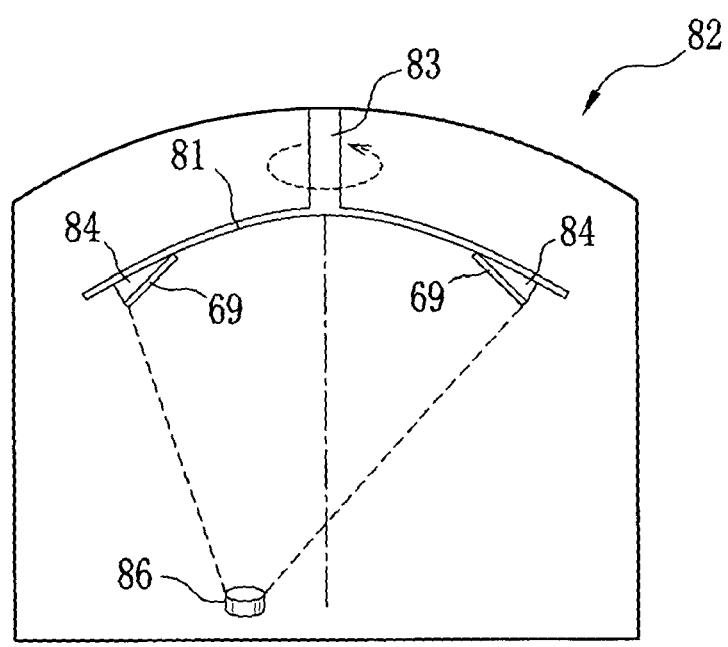
FIG. 5 is an explanatory view illustrating a configuration of a rotary evaporator.

Note that the present invention is not limited to the oscillating evaporator 60. As shown in FIG. 5, for example, the phase compensator can be manufactured with a rotary evaporator 82. The rotary evaporator 82 includes a base 81, a rotary shaft 83, baseplate holders 84 and an evaporation source 86. The base 81 is rounded inward or concavely when viewed from the evaporation source 86, and rotates in one direction around the rotary shaft 83. Attached to the concave surface of the base 81 are the baseplate holders 84 each of which holds the base plate 69. The evaporation source 86 is shifted by a predetermined distance from underneath the rotary shaft 83. Namely, the evaporation source 86 is disposed eccentric to a rotation axis of the base 81.

Figure 6:
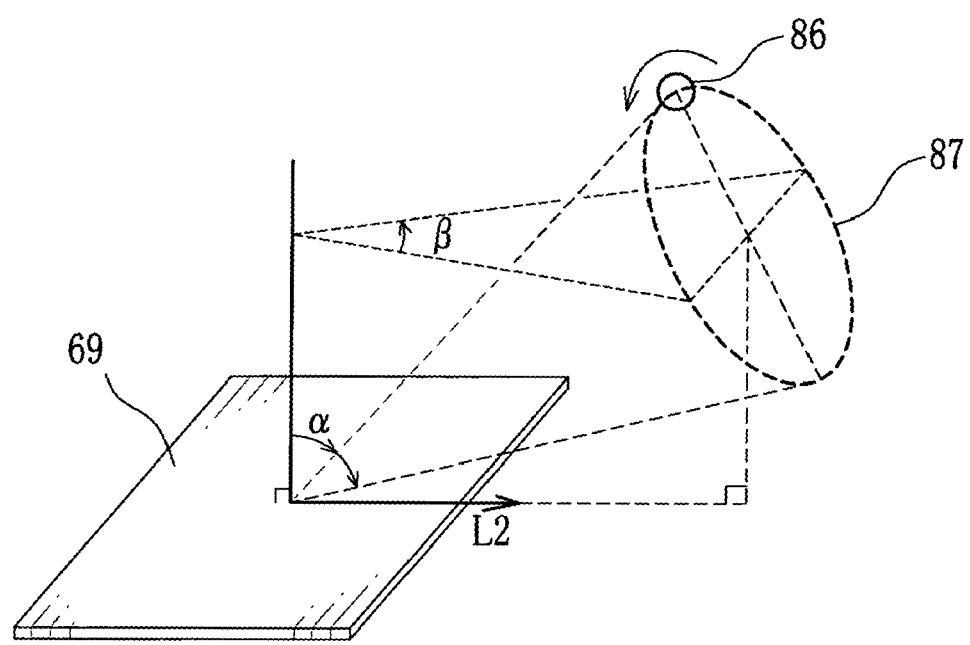
FIG. 6 is an explanatory view illustrating a deposition direction to a revolving base plate.

As shown in FIG. 6, when viewed from the base plate 69 rotating with the base 81, the evaporation source 86 revolves in a circular path 87. This leads the polar axis α and the azimuth angle β to change continuously within predetermined angular ranges. Therefore, a deposition material flies continuously from the different azimuth angles β within a predetermined angular range, and accumulates in the direction of the principal refractive index n2, increasing the value of the principal refractive index n2 accordingly. Additionally, controlling the revolution speed of the base 81 much faster than the accumulation speed of the deposition material can prevent a physical microstructure of a biaxial birefringent component from twisting in an spiral shape, and allow the principal refractive index n3 to be tilted in a direction (average deposition direction) L2 defined by a time-averaged position of the evaporation source 86.

It is preferred, when using the rotary evaporator 82, to isolate the base plate 69 from the evaporation source 86 in a part of a revolving path of the base plate 69. For example, an isolation plate with a slit may be provided between the base 81 and the evaporation source 86. This isolation plate changes a distribution of the deposition material's polar angle α and azimuth angle α to the base plate 69. Therefore, adjusting the isolation area changes the value T and the tilt angles of the principal refractive indices n1 and n3 to the base plate surface.

The phase compensator thus fabricated is arranged such that the tilt direction of the tilt components in the liquid crystal layer and the slow axis of the frontal retardation of the phase compensator become approximately perpendicular to each other with reference to the light rays in a necessary field-of-view range. Additionally, the phase compensator is oriented to invert the increase and decrease of the phase difference, compared to the phase difference caused by the tilt components in the liquid crystal layer.

The phase compensator thus arranged can compensate the angle dependence of the phase difference caused to the light rays in a predetermined field-of-view range. As a result, the field-of-view is expanded for the liquid crystal panel, and image contrast of the liquid crystal projector is improved.

Figure 7:
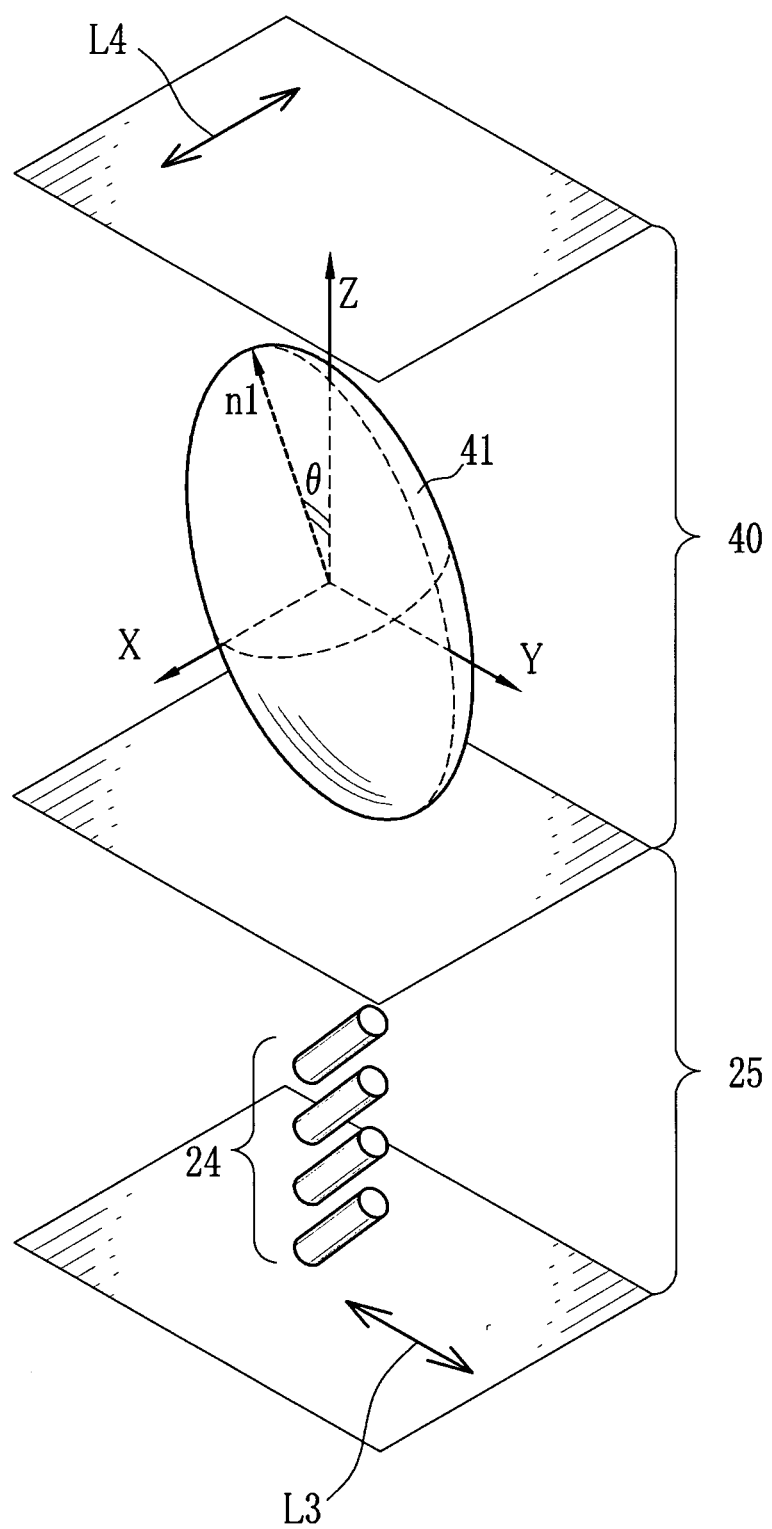
FIG. 7 is an explanatory view for allocation of the biaxial birefringent component with respect to a liquid crystal panel.

Namely, as shown in FIG. 7, the biaxial birefringent component 40 is arranged such that the tilt components 24 in the liquid crystal layer 25 and the index ellipsoid 41 are tilted in the Y-axis positive and negative directions respectively with reference to the Z-axis. In this state, a slow axis direction L3 of the frontal retardation caused by the tilt components 24 is parallel to the Y-axis. Also, a slow axis direction L4 of the frontal retardation caused by the biaxial birefringent component 40 is parallel to the X-axis. The slow axis directions of the tilt components 24 and the biaxial birefringent component 40 are therefore perpendicular to each other.

Since the liquid crystal layer 25 of the TN liquid crystal panel 20 contains the tilt components 24a, 24b which reside near the upper and the lower substrates as mentioned above, two phase compensators having the biaxial birefringent component 40 are necessary to deal with the tilt components 24a, 24b respectively. In particular, two phase compensators are arranged such that their slow axes of the frontal retardation become perpendicular to each other. It is however not necessary to arrange these phase compensators separately, but possible to form the biaxial birefringent component 40 on both sides of a single base plate. Alternatively, the biaxial birefringent component 40 may be overlaid on one side of the base plate. It should be noted that even a single layer of the biaxial birefringent component 40 can compensate the phase difference caused by one of the tilt components 24a, 24b, and improve the contrast of the TN liquid crystal panel to a certain extent.

In VAN liquid crystal panels, on the other hand, the liquid crystal molecules are aligned with a pretilt of about 5° to surface normal of a substrate, and they cause phase difference to the light rays in a predetermined field-of-view range. Therefore, the VAN liquid crystal panel requires one phase compensator having the biaxial birefringent component 40, which is arranged such that its slow axis of the frontal retardation becomes perpendicular to a pretilt direction of the liquid crystal molecules.

When combined with an OCB liquid crystal panel, two phase compensators having the biaxial birefringent component 40 are overlaid such that their index ellipsoids are tilted in opposite directions and that their slow axes of the frontal retardation become parallel to each other. In ECB liquid crystal panels, the tilt components reside at two spots in a liquid crystal layer in a voltage applied state, and are aligned parallel to each other. Therefore, one phase compensator having the biaxial birefringent component 40 is necessary for the ECB liquid crystal panel.

The biaxial birefringent component 40 may be combined with a negative C-plate. This C-plate can be an organic polymer plate, or a thin film of a structural birefringent component.

Providing at least one biaxial birefringent component 40 between a polarizer and the liquid crystal panel will improve contrast of projection images on a screen dramatically, whatever the liquid crystal mode is. This feature is described below with a few examples.

Example 1

Using the oscillating evaporator 60, a $ZrO_2$—$TiO_2$ composition was obliquely deposited onto a base plate of borosilicate glass, at a deposition speed of 0.2 nm per second, so as to form a biaxial birefringent component with a physical film thickness of 1.5 μm. A distance between an evaporation source and the base plate was 600 mm, and a polar angle α was 70°. The base plate was oscillated between a ±30° range at a speed of 10 cycles per minute. A cross section of the oblique deposition film thus obtained was observed with SEM, which found a regular microstructure tilted at 35° to a surface normal of the base plate. It was, however, not found a periodic microstructure corresponding to oscillation of the base plate.

This phase compensator having a biaxial birefringent component exhibited a frontal retardation of 65 nm to 550 nm light, with principal refractive indices n1 of 1.760, n2 of 1.730 and n3 of 1.640. The value T was 0.75. A tilt angle θ of an index ellipsoid to the surface normal of the base plate was 24°. When viewed from the base plate, a slow axis of the frontal retardation of this phase compensator was perpendicular to an orthogonal projection of an evaporation source's rotation axis onto the base plate.

Example 2

A phase compensator having a biaxial birefringent component on a base plate was obtained under the same conditions as Example 1, except that a physical film thickness was 2.0 μm. This phase compensator exhibited a frontal retardation of 10 nm to 550 nm light, with principal refractive indices n1 of 1.800, n2 of 1.782 and n3 of 1.743. The value T was 0.68. A tilt angle θ of an index ellipsoid to the surface normal of the base plate was 24°. Similar to Example 1, when viewed from the base plate, a slow axis of the frontal retardation of this phase compensator was perpendicular to an orthogonal projection of an evaporation source's rotation axis onto the base plate. This phase compensator was then combined with a liquid crystal projector having a VAN liquid crystal panel, and contrast of a projection image was improved from 800:1 to 1500:1.

Example 3

Using the rotary evaporator 82, tantalum pentoxide was obliquely deposited onto a glass base plate, at a deposition speed of 0.2 nm per second, so as to form a biaxial birefringent component with a physical film thickness of 1.0 μm. A distance between an evaporation source and a rotary shaft of a base was 400 mm, and the base plate was placed 450 mm distant from the rotary shaft and held at 1000 mm high. The base was rotated at a speed of 10 cycles per minute, and during this rotation a polar angle α of a deposition direction was changing from 72° to 35°, and an azimuth angle β was changing between a ±23° range.

This phase compensator having a biaxial birefringent component exhibited a frontal retardation of 50 nm to 550 nm light, with principal refractive indices n1 of 1.800, n2 of 1.782 and n3 of 1.744. The value T was 0.68. A tilt angle θ of an index ellipsoid to the surface normal of the base plate was 24°. When viewed from the base plate, a slow axis of the frontal retardation of this phase compensator was perpendicular to an orthogonal projection of an evaporation source's rotation axis onto the base plate. Two of these phase compensators were then combined with a liquid crystal projector having a TN liquid crystal panel, and contrast of a projection image was improved from 450:1 to 1000:1.

Figure 8:
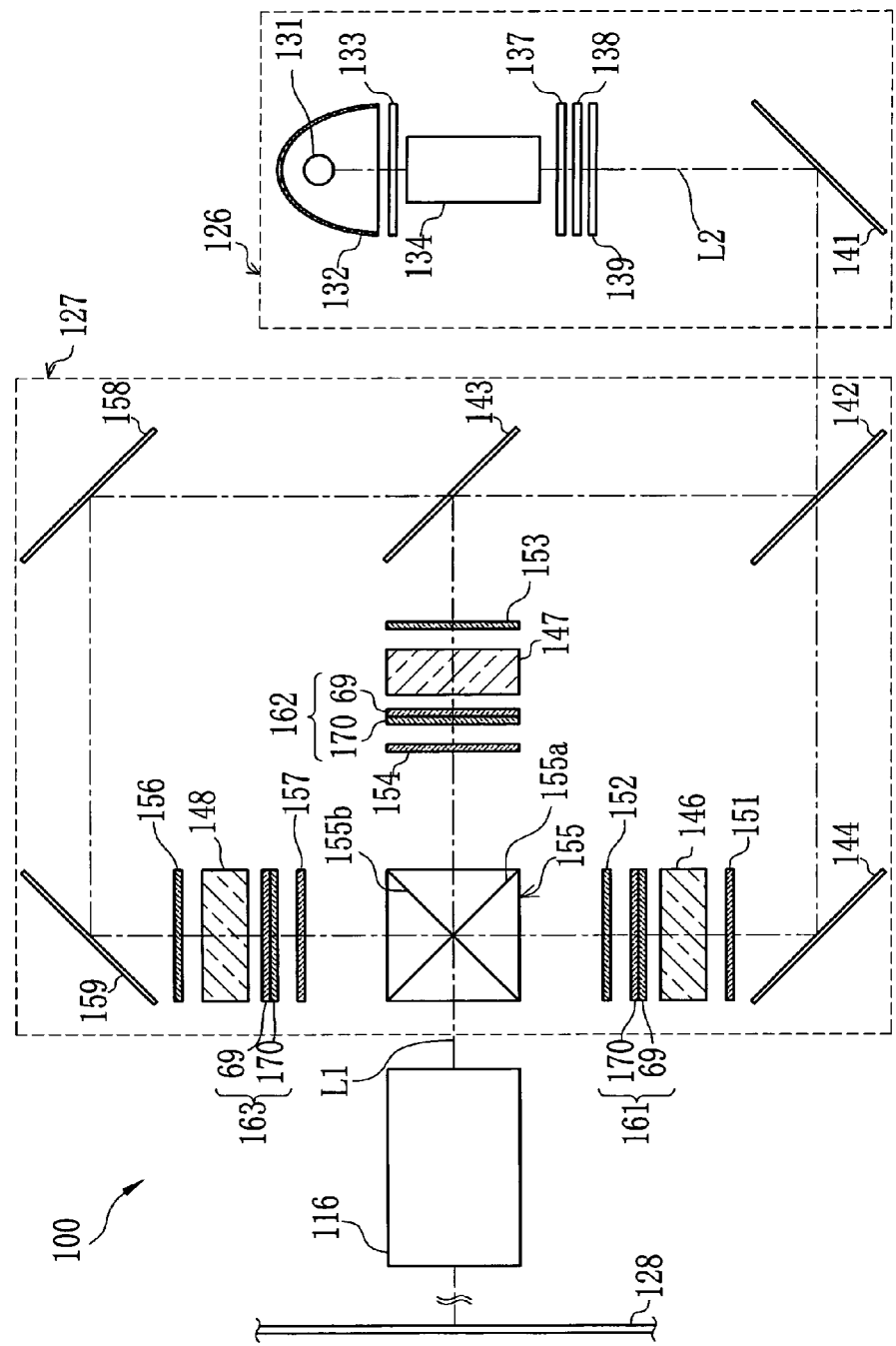
FIG. 8 is a configuration diagram for a liquid crystal projector having a phase compensator having the biaxial birefringent component.

As shown in FIG. 8, a liquid crystal projector 100 includes a projection lens 116, a light source unit 126 and an information light producing section 127 to produce information light from light rays emitted by the light source unit 126.

The light source unit 126 includes a lamp 131, a reflecting mirror 132, a UV-cut filter 133, an integrator 134, a relay lens 137, a collimate lens 138, a polarizer 139 and a mirror 141.

The lamp 131 is a high-intensity light source, such as a xenon lamp, and emits natural non-polarized white light. The white light from the lamp 131 enters the UV-cut filter 133 to remove ultraviolet rays, and is directed to the integrator 134. The reflecting mirror 132 has an elliptic curved surface, for example, and the lamp 131 is placed near one focal point of this curved surface. Another focal point of the curved surface resides near one end of the integrator 134. The reflecting mirror 132 can therefore guide the white light from the lamp 131 to the integrator 134 efficiently. The integrator 134 blends the white light from the lamp 131 uniformly, and guides it to the collimate lens 138 through the relay lens 137. The collimate lens 138 converts the light from the integrator 134 to parallel light to a light source axis L2, and guides it to the polarizer 139. The polarizer 139 converts the light from the collimate lens 138 into linearly-polarized light, and guides it through the mirror 141 to a dichroic mirror 142 of the information light producing section 127.

The information light producing section 127 includes the dichroic mirrors 142, 143, liquid crystal panels (liquid crystal cells) 146, 147, 148, phase compensators 161, 162, 163 and a cross-dichroic prism 155.

The dichroic mirror 142 is oriented to form a 45-degree angle between its surface normal and an optical axis of the incident light. This dichroic mirror 142 transmits red light components in the S-polarized white light coming from the light source unit 126, and guides them to a reflecting mirror 144. The reflecting mirror 144 directs the red light from the dichroic mirror 142 to the liquid crystal panel 146. At the same time, the dichroic mirror 142 reflects green and blue light components in the white light, and directs them to the dichroic mirror 143. The dichroic mirror 143 is oriented to form a 45-degree angle between its surface normal and an optical axis of the incident light. The dichroic mirror 143 reflects the green light components in the light from the dichroic mirror 142, and directs them to the liquid crystal panel 147. At the same time, the dichroic mirror 143 transmits the blue light components in the light from the dichroic mirror 142, and directs them to a reflecting mirror 158. This blue light is reflected by the reflecting mirror 158 and another reflecting mirror 159, and directed to the liquid crystal panel 148.

The liquid crystal panel 146 is a transmission-type LCD, and placed between a polarizer 151 and an analyzer 152. The polarizer 151 converts light rays passing through the liquid crystal panel 146 into linearly-polarized rays along a transmission axis. The analyzer 152 is arranged in so-called crossed Nichol such that its transmission axis is orthogonal to the transmission axis of the polarizer 151, so as to transmit only the light rays, among the light rays coming from the liquid crystal panel 146, polarized in the transmission axis direction and direct them to the cross-dichroic prism 155. The liquid crystal panel 146 is controlled by a projector drive section (not shown), and displays a red component in image data, retrieved from a computer or the like, as a grayscale image. Therefore, the red light from the reflecting mirror 144 is converted into red information light carrying red component information of a projection image, as it passes through the polarizer 151, the liquid crystal panel 146 and the analyzer 152.

Similarly, the liquid crystal panel 147 is a transmission-type LCD, placed between a polarizer 153 and an analyzer 154, and displays a green component in the image data as a grayscale image. The green light from the dichroic mirror 143 is converted into green information light carrying green component information of the projection image, as it passes through the polarizer 153, the liquid crystal panel 147 and the analyzer 154. Then the green information light enters the cross-dichroic prism 155. Similarly, the liquid crystal panel 148 is a transmission-type LCD, placed between a polarizer 156 and an analyzer 157, and displays a blue component in the image data as a grayscale image. The blue light from the reflecting mirror 159 is converted into blue information light carrying blue component information of the projection image, as it passes through the polarizer 156, the liquid crystal panel 148 and the analyzer 157. Then, the blue information light enters the cross-dichroic prism 155.

The cross-dichroic prism 155 is made into a substantially cubic shape using a glass or such transparent material, and has two crossed dichroic surfaces 155a, 155b. The dichroic surface 155a reflects red light and transmits green light. On the other hand, the dichroic surface 155b reflects blue light and transmits green light. Namely, the cross-dichroic prism 155 combines the red, green and blue information light into projection light, which is then projected as a full-color projection image on a screen 128.

As mentioned above, the phase compensator 161 is a thin film of a biaxial birefringent component 170 made of an inorganic material obliquely deposited on the base plate 69. The phase compensator 161 is placed between the polarizer 151 and the analyzer 152, and compensates the retardance of a light ray passing through the polarizer 151, the liquid crystal panel 146 and the analyzer 152. The phase compensator 162, having the same structure as the phase compensator 161, is placed between the polarizer 153 and the analyzer 154, and compensates the retardance of a light ray passing through the polarizer 153, the liquid crystal panel 147 and the analyzer 154. Similarly, the phase compensator 163 compensates the retardance of a light ray passing through the polarizer 156, the liquid crystal panel 148 and the analyzer 157.

Each of the phase compensators 161 to 163 has only be allocated between the polarizer and the analyzer, and can be placed between the polarizer and the liquid crystal panel or between the analyzer and the liquid crystal panel. Additionally, the biaxial birefringent component may be integrated with the polarizer, the analyzer or the liquid crystal panel. Furthermore, this phase compensator having the biaxial birefringent component may also be used with reflection-type liquid crystal panels.

Various changes and modifications are possible in the present invention and may be understood to be within the present invention.

INDUSTRIAL APPLICABILITY

The present invention is preferably applied to the image display apparatus with a liquid crystal panel, such as liquid crystal projectors and liquid crystal televisions.

The invention claimed is:

1. A method for manufacturing a biaxial birefringent component by oblique deposition of an inorganic material on a base plate, comprising a step of:
    performing said oblique deposition while periodically changing an azimuth angle of an evaporation path of said inorganic material to said base plate within a predetermined angular range.

2. The method of claim 1, wherein said oblique deposition step further comprises:
    oscillating said base plate between a part of a circular path around an axis parallel to a surface normal of said base plate.

3. The method of claim 1, wherein said oblique deposition step further comprises:
    revolving said base plate; and
    evaporating and depositing said inorganic material on said revolving base plate from an evaporation source disposed at a predetermined distance from an axis of said revolution.

4. The method of claim 3, wherein said base plate is isolated from said evaporation source in a part of a path of said revolution.

* * * * *